(12) United States Patent
Braun et al.

(10) Patent No.: US 10,084,454 B1
(45) Date of Patent: Sep. 25, 2018

(54) RQL MAJORITY GATES, AND GATES, AND OR GATES

(71) Applicants: Alexander L. Braun, Baltimore, MD (US); David Christopher Harms, Linthicum Heights, MD (US)

(72) Inventors: Alexander L. Braun, Baltimore, MD (US); David Christopher Harms, Linthicum Heights, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/886,626

(22) Filed: Feb. 1, 2018

(51) Int. Cl.
| H03K 19/195 | (2006.01) |
| G11C 11/44 | (2006.01) |
| H03K 19/20 | (2006.01) |
| H01L 39/22 | (2006.01) |

(52) U.S. Cl.
CPC ............ H03K 19/195 (2013.01); G11C 11/44 (2013.01); H01L 39/223 (2013.01); H03K 19/20 (2013.01)

(58) Field of Classification Search
None
See application file for complete search history.

(56) References Cited

U.S. PATENT DOCUMENTS

| 3,094,685 | A | | 6/1963 | Crowe | |
| 4,956,642 | A | * | 9/1990 | Harada | H03M 1/368 327/527 |
| 5,233,243 | A | | 8/1993 | Murphy et al. | |
| 6,310,488 | B1 | * | 10/2001 | Hasegawa | H03K 19/1952 326/3 |
| 6,608,518 | B2 | | 8/2003 | Furuta et al. | |
| 6,734,699 | B1 | | 5/2004 | Herr et al. | |
| 6,756,925 | B1 | * | 6/2004 | Leung | H04L 25/4904 331/11 |
| 7,129,869 | B2 | * | 10/2006 | Furuta | G11C 7/06 341/133 |
| 7,227,480 | B2 | * | 6/2007 | Furuta | H03K 3/38 341/126 |
| 7,724,020 | B2 | * | 5/2010 | Herr | B82Y 10/00 326/3 |
| 7,786,748 | B1 | | 8/2010 | Herr | |

(Continued)

OTHER PUBLICATIONS

U.S. Office Action corresponding to U.S. Appl. No. 15/886,652, dated May 24, 2018.

(Continued)

*Primary Examiner* — Crystal L Hammond
(74) *Attorney, Agent, or Firm* — Tarolli, Sundheim, Covell & Tummino LLP

(57) ABSTRACT

An reciprocal quantum logic (RQL) gate circuit has an input stage having logical inputs asserted based on receiving positive single flux quantum (SFQ) pulses and an amplifying output stage comprising a JTL to deliver an output signal. The input stage includes two or more storage loops, at least two being associated each with a logical input, each comprising an input Josephson junction (JJ), a storage inductor, and a logical decision JJ, the logical decision JJ being common to all the storage loops associated with the logical inputs and being configured to trigger based on biasing provided by one or more currents stored in the storage loops and a bias signal provided to the circuit. The output stage asserts an output based on the triggering of the logical decision JJ.

20 Claims, 10 Drawing Sheets

(56) References Cited

U.S. PATENT DOCUMENTS

| | | | |
|---|---|---|---|
| 7,903,456 B2 | 3/2011 | Kirichenko et al. | |
| 7,944,253 B1 * | 5/2011 | Kirichenko | H03K 23/763 327/117 |
| 7,969,178 B2 | 6/2011 | Przybysz et al. | |
| 7,977,964 B2 | 7/2011 | Herr | |
| 8,138,784 B2 | 3/2012 | Przybysz et al. | |
| 8,489,163 B2 * | 7/2013 | Herr | H03K 3/38 505/190 |
| 8,611,974 B2 * | 12/2013 | Maibaum | B82Y 10/00 327/367 |
| 9,455,707 B2 * | 9/2016 | Herr | H03K 3/38 |
| 9,543,959 B1 * | 1/2017 | Carmean | H03K 19/195 |
| 9,595,970 B1 | 3/2017 | Reohr et al. | |
| 9,646,682 B1 | 5/2017 | Miller et al. | |
| 9,712,172 B2 | 7/2017 | Shauck et al. | |
| 9,780,765 B2 | 10/2017 | Naaman et al. | |
| 9,812,192 B1 | 11/2017 | Burnett et al. | |
| 9,876,505 B1 | 1/2018 | Dai et al. | |
| 9,887,700 B2 | 2/2018 | Carmean et al. | |
| 9,905,900 B2 | 2/2018 | Herr et al. | |
| 9,917,580 B2 | 3/2018 | Naaman | |
| 9,972,380 B2 | 5/2018 | Ambrose | |
| 2003/0011398 A1 | 1/2003 | Herr | |
| 2003/0016069 A1 | 1/2003 | Furuta et al. | |
| 2009/0153180 A1 | 6/2009 | Herr | |
| 2011/0133770 A1 * | 6/2011 | Przybysz | B82Y 10/00 326/5 |
| 2016/0164505 A1 | 6/2016 | Naaman et al. | |
| 2017/0104491 A1 * | 4/2017 | Shauck | H03K 19/195 |
| 2017/0359072 A1 | 12/2017 | Hamilton et al. | |

OTHER PUBLICATIONS

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

* cited by examiner

US 10,084,454 B1

RQL MAJORITY GATES, AND GATES, AND OR GATES

TECHNICAL FIELD

The present invention relates generally to quantum and classical digital superconducting circuits, and specifically to reciprocal quantum logic (RQL) gates that provide majority, AND, and OR functions.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

A majority gate is a logical gate that returns true if and only if more than 50% of its inputs are true. Phase-mode logic allows digital values to be encoded as superconducting phases of one or more JJs. For example, a logical "1" may be encoded as a high phase and a logical "0" may be encoded as a low phase. For example, the phases may be encoded as being zero (meaning, e.g., logical "0") or $2\pi$ (meaning, e.g., logical "1"). These values persist across RQL clock cycles because there is no requirement for a reciprocal pulse to reset the JJ phase.

SUMMARY

One example includes a reciprocal quantum logic (RQL) gate circuit having input and output stages. The input stage has at least two logical inputs each asserted based on receiving a positive single flux quantum (SFQ) pulse. The input stage has two or more storage loops, each logical input being associated with at least one of the storage loops. Each of the storage loops associated with a logical input includes an input Josephson junction (JJ), a storage inductor, and a logical decision JJ. The logical decision JJ is common to all the storage loops associated with the logical inputs and is configured to trigger based on biasing provided by one or more currents stored in the storage loops and a bias signal provided to the circuit. The output stage includes Josephson transmission line (JTL) circuitry configured to assert an output based on a triggering of the logical decision JJ.

Another example includes a method of determining a logic value. One or more positive SFQ pulses are provided to assert one or more logical inputs of an RQL gate having at least two logical inputs. One or more positive currents are thereby placed in one or more input storage loops in the RQL gate. The RQL gate can have at least three such storage loops, for example. A logical decision JJ in the RQL gate is thereby triggered. An assertion signal is thereby propagated from an output of the RQL gate.

Yet another example includes a circuit having at least two logical input JTLs each connected to a dovetail node, each logical input JTL comprising a storage loop input inductor connected, at a respective first node, to an input JJ and a storage inductor, the storage loop input inductor, input JJ, and storage inductor of each logical input JTL being sized to provide unidirectional data flow. The circuit further includes a logical decision JJ connected between the dovetail node and a low-voltage node, such that respective storage loops are formed by the input JJ and storage inductor of each input JTL and the logical decision JJ. The circuit further includes output JTL circuitry connecting the dovetail node and a logical output node to amplify a logical decision signal made by the logical decision JJ. The circuit further includes a bias input providing a bias signal having an AC component. The circuit is configured to provide an asserted or de-asserted logical output signal at the output node based on asserted or de-asserted logical input signals provided to the logical input JTLs, respectively.

DETAILED DESCRIPTION

This disclosure relates generally to logical gate circuits for use in reciprocal quantum logic (RQL) systems and related methods. This disclosure more specifically relates to majority gates, AND gates, and OR gates.

Figure 1:
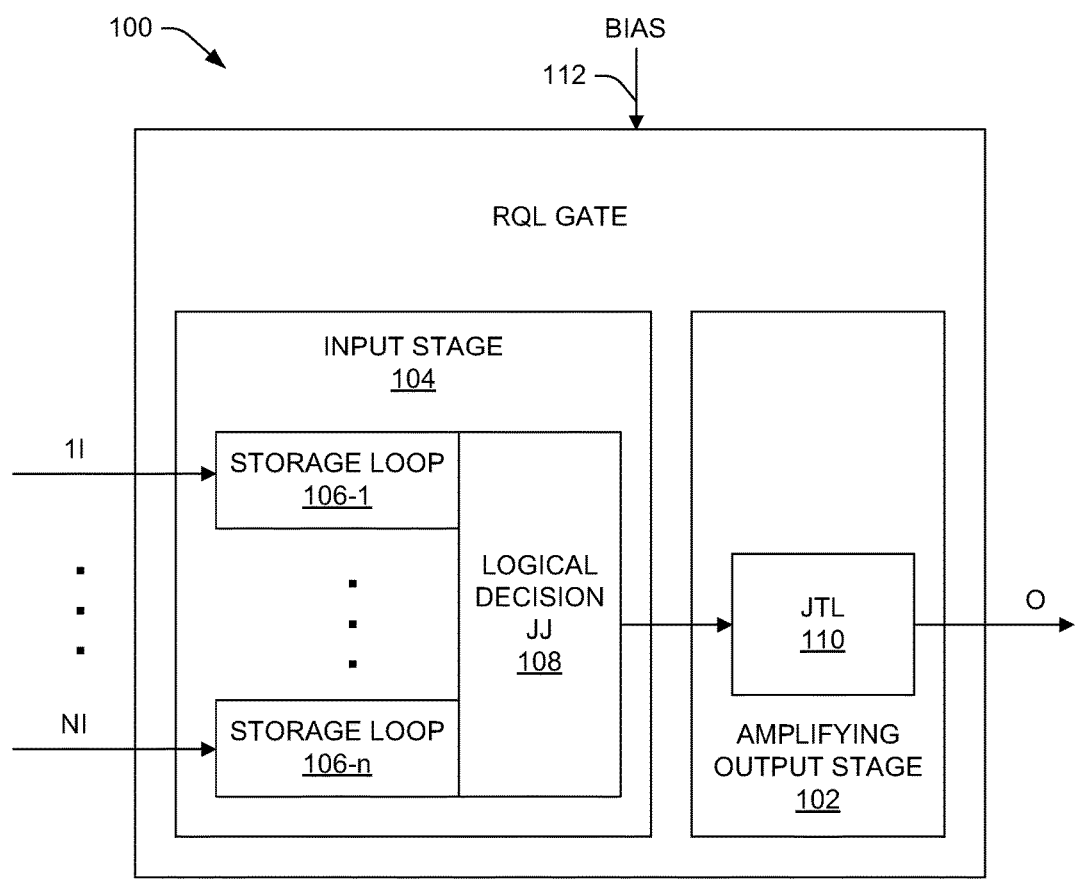
FIG. 1 is a block diagram of an example reciprocal quantum logic (RQL) gate.

Reciprocal quantum logic (RQL) logic gates can integrate a Josephson transmission line (JTL) into their output to provide the required amplification to drive a load. FIG. 1 shows RQL gate 100 having at least two logical inputs 1I through NI and output O. Gate 100 includes amplifying output stage 102, configured to provide output O, and input stage 104, configured to receive the two or more inputs 1I through NI, which can consist, for example, of positive or negative single flux quantum (SFQ) pulses corresponding to asserted or de-asserted logic states, respectively. Each input has associated with it at least one storage loop among storage loops 106-1 through 106-n. Although input stage 104 is illustrated as having one storage loop per input, each input can have more than one storage loop associated with it. Logical decision Josephson junction (JJ) 108 is common to (i.e., shared by) all logical input storage loops, and triggers based on one or more inputs 1I through NI. The assertion or de-assertion of output O is based on the triggering of logical decision JJ 108. For example, output O can propagate a positive SFQ pulse corresponding to an asserted output logic state and a negative SFQ pulse corresponding to a de-asserted output logic state. Output stage 102 includes a Josephson transmission line (JTL) to amplify the output of logical decision JJ 108.

The triggering of logical decision JJ 108 can be based not only on inputs 1I through NI, but also on a bias signal 112 provided to input stage 104. Bias signal 112 can provide both AC and DC bias. Thus, for example, bias signal 112 can act as a clock to RQL gate 100, causing the evaluation of the inputs 1I through NI to produce the output O at certain points in time according to the AC component of bias signal 112.

Figure 2A:
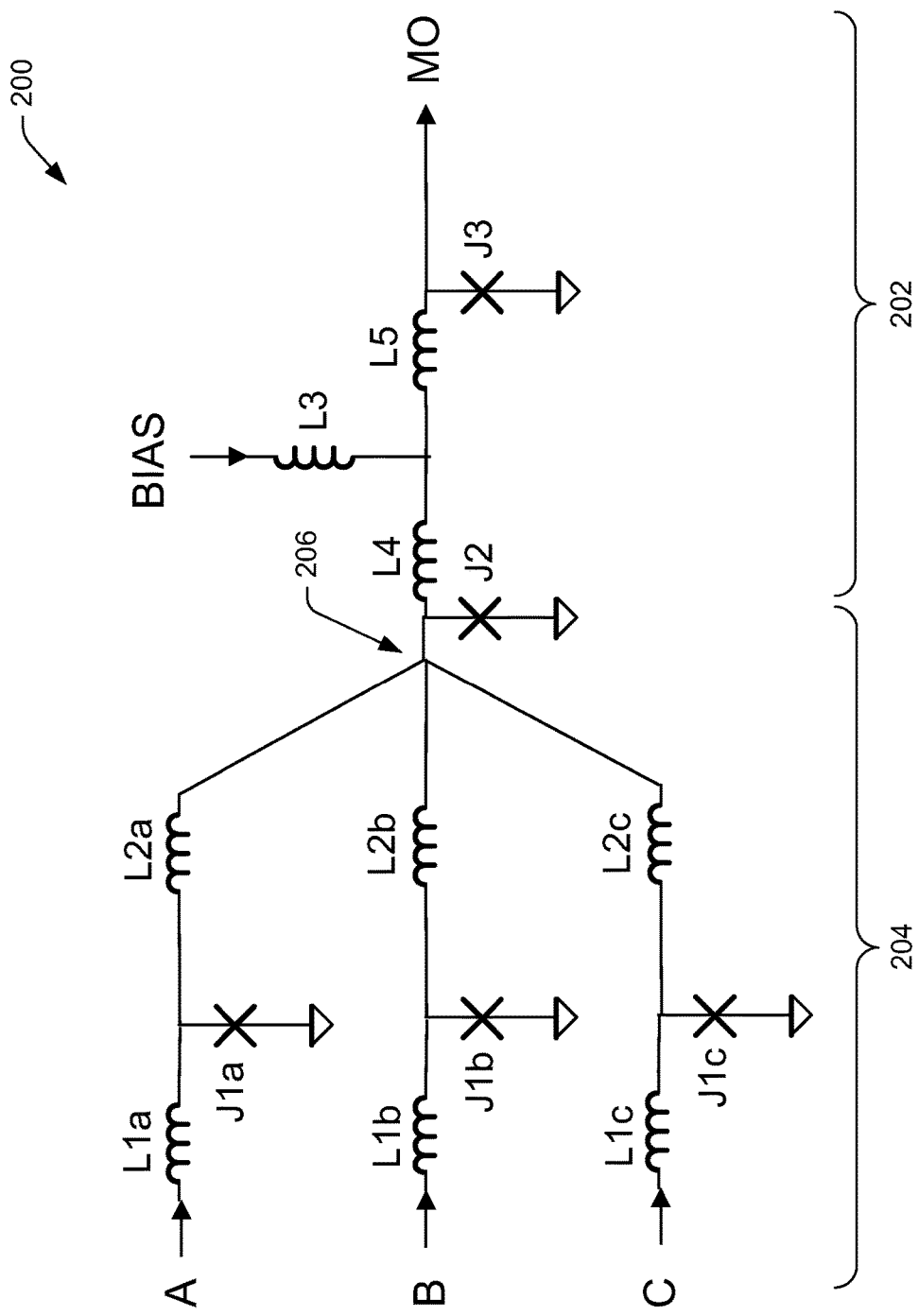
FIG. 2A is a circuit diagram of an example 2-of-3 majority gate.

FIG. 2A illustrates an RQL gate that can have a number of configurations to provide a number of different logical functions. Specifically, the illustrated configuration provides an RQL majority gate circuit 200, producing an asserted output only when a majority of the logical inputs are asserted. More specifically, gate 200 is a 2-of-3 majority gate, producing an assertion signal at output MO only when two or three of inputs A, B, and C are asserted. Gate circuit 200 has a JTL output stage 202 to provide signal amplification and an input stage 204 having a number of JTL input branches that join at dovetail node 206. Together with logical decision Josephson junction (JJ) J2, the input branches form storage loops to receive and store inputs until a logical decision can be made, i.e., until a logic condition is met.

In input stage 204, a separate input storage loop is associated with each input. Thus, for example, the input storage loop for input A includes JJs J1a and J2, as well as inductor L2a. Leading inductor L1a allows input A to be connected to a driving JTL or to the output of another gate. Logical decision JJ J2, which is common to all input storage loops, performs the logic operation of majority gate 200. The output of logical decision JJ J2 serves as the input of JTL stage 202.

The selections of component sizes in each storage loop in input stage 204 provide a unidirectional data flow. Circuit 200 operates on SFQ pulses, which each place one $\Phi_0$ (about 2.07 mA-pH) of current into a storage loop. The magnitude of current through such a storage loop is determined by the size of the storage inductor in the storage loop. Thus, for each input, the inductance value of the storage loop input inductor (e.g., L1a) can be small (e.g., between about 8 pH and 9 pH, e.g., 8.5 pH) in comparison to the inductance value of the storage inductor (e.g., L2a). On the other hand, the storage inductor can sized to be relatively large (e.g., between about 30 pH and 40 pH, e.g., 35 pH) (e.g., about four times larger than the corresponding storage loop input inductor) to reduce the magnitude of the stored current induced by an input SFQ pulse. In some examples, the magnitude of a current introduced at an input (e.g., A) is about four times larger than the current stored in a storage loop. The input JJ for input A, J1a, is also sized such that the driving JTL is capable of flipping this JJ to put current into the storage loop, but the current in the storage loop is never sufficient to unflip input JJ J1a and allow the stored pulse to back out of the input.

The storage loops associated with inputs B and C can have the same structure as the storage loop for input A, all overlapping at logical decision JJ J2. Output MO may also be connected to a JTL or to the input of another gate, for example, to propagate positive or negative output pulses representing the assertion or de-assertion of gate 200 to logical "high" or "low," respectively.

Logical decision JJ J2 performs the logic function of the input stage 204 of gate 200. The combination of any two inputs, plus the bias BIAS, is sufficient to switch logical decision JJ J2 in either direction. As mentioned with respect to bias signal 112 in gate 100 of FIG. 1, an AC component (e.g., a sine wave component) of bias signal BIAS in gate 200 of FIG. 2A can act as a clock signal to input stage 204, which can evaluate the logical inputs twice per cycle of the clock signal. The AC phase of bias signal BIAS can have alternating positive and negative portions. During the positive portion of the AC phase, input stage 204 evaluates inputs A through C to decide whether the output of input stage 204 should be asserted; during the negative portion of the AC phase, input stage 204 evaluates inputs A through C to decide whether the output of input stage 204 should be de-asserted.

Figure 2B:
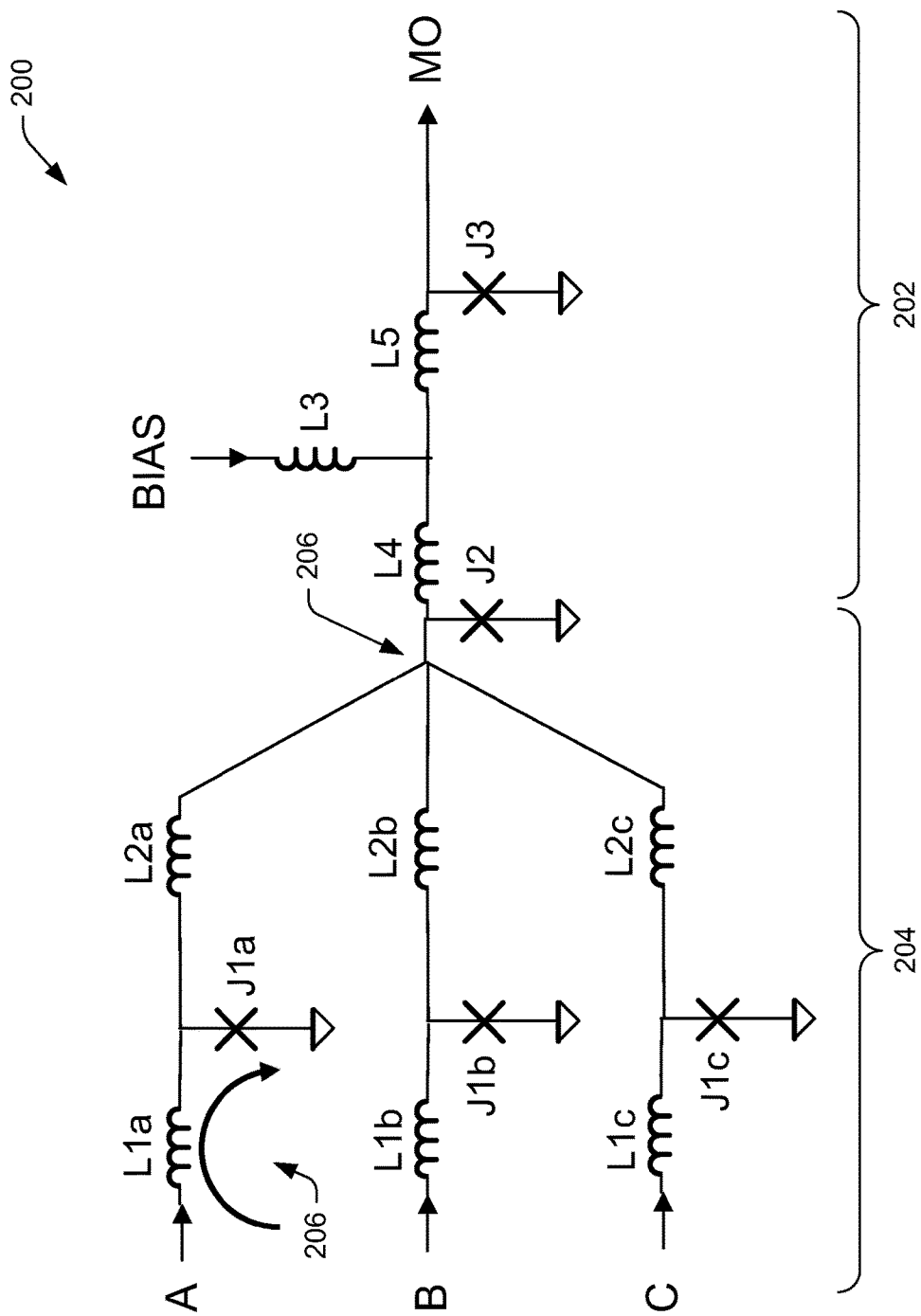
FIGS. 2B-2E illustrate the functioning of the circuit of FIG. 2A as input signals propagate through the circuit to produce an output signal.
Figure 2C:
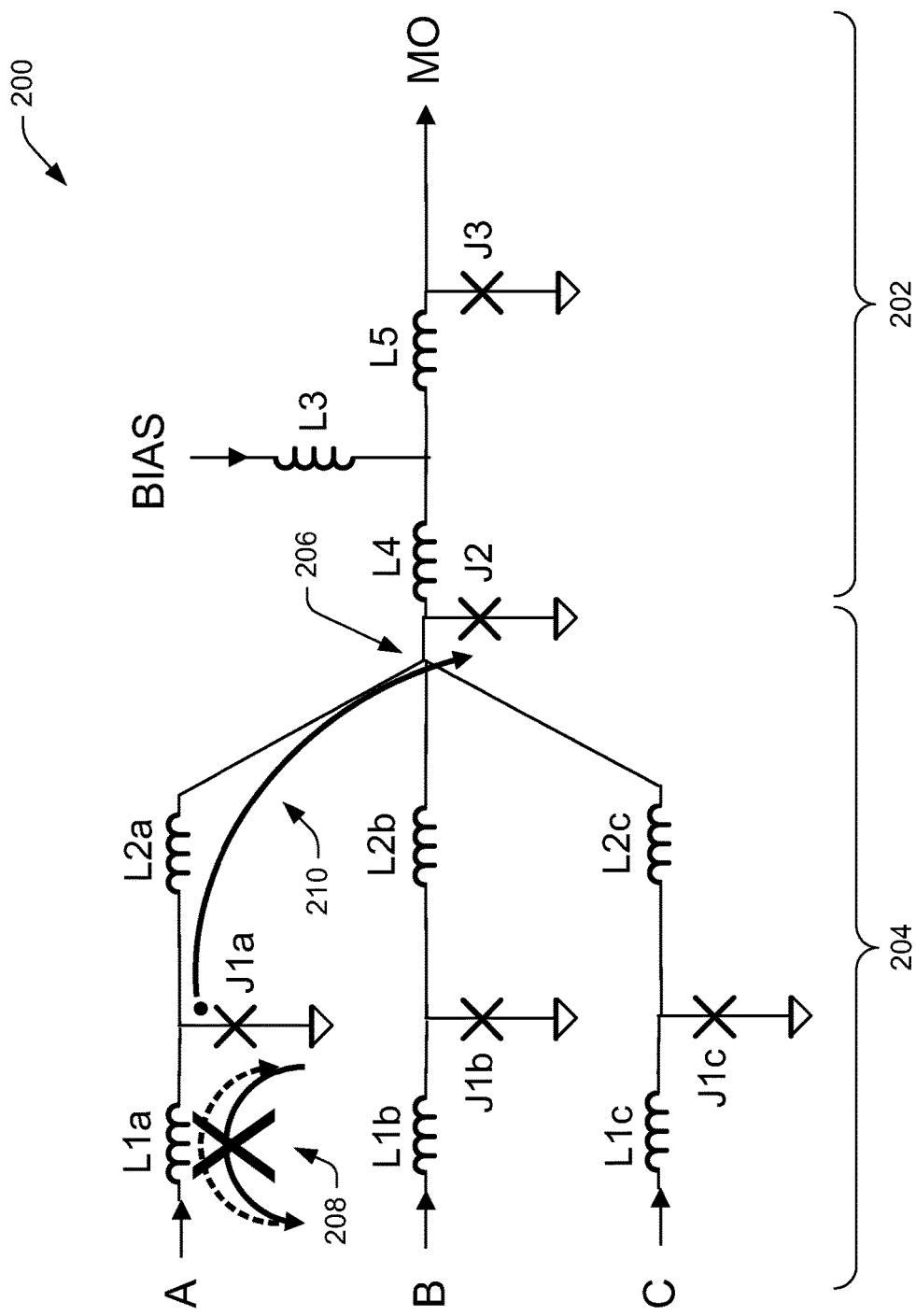

The functioning of a single input branch of input stage 204 will now be described. As shown in FIG. 2B, an input pulse, e.g., a single flux quantum (SFQ) pulse, arriving at input A induces a positive superconducting current 206 through leading inductor L1a and input JJ J1a, which in turn triggers input JJ J1a, raising its superconducting phase to $2\pi$. The triggering of input JJ J1a induces an equal and opposite current 208 (e.g., one $\Phi_0$ worth of current) in leading inductor L1a, annihilating the initial input current 206, and also induces a positive superconducting current 210 in the loop formed by input JJ J1a, input loop storage inductor L2a, and logical decision JJ J2, as shown in FIG. 2C. This storage loop current 210 alone is insufficient to trigger logical decision JJ J2, and will remain trapped indefinitely in its storage loop if no further inputs are applied. A negative input pulse arriving at input A would reverse the above-described effects, annihilating the positive storage loop current 210 and returning the circuit to its initial state. Inputs B and C operate in exactly the same manner, as they are perfectly symmetrical with input A.

Storage loop current from one input alone is insufficient to trigger logical decision JJ J2, even with the AC and DC bias BIAS, because of the majority structure of input stage 204. The additional load presented to logical decision JJ J2 by the components associated with unasserted inputs B and C inhibits logical decision JJ J2 from triggering. Thus, assertion of a majority of inputs is required to cause J2 to trigger in circuit 200.

The functioning of input stage 204 will now be described for the condition when a majority of the inputs are asserted, i.e., when positive currents associated with at least two input branches circulate in storage loops associated with at least two inputs, each input having been asserted in the manner described above. Loop currents in the storage loops induced by positive input pulses at respective inputs will persist until subsequent negative pulses on the respective inputs remove them, or until the clocking function of the AC component of bias signal BIAS triggers logical decision JJ J2 to transform the inputs into a logic decision. Because of this storage functionality, inputs needed to amount to a majority number of input assertions need not arrive within the same clock cycle.

Figure 2D:
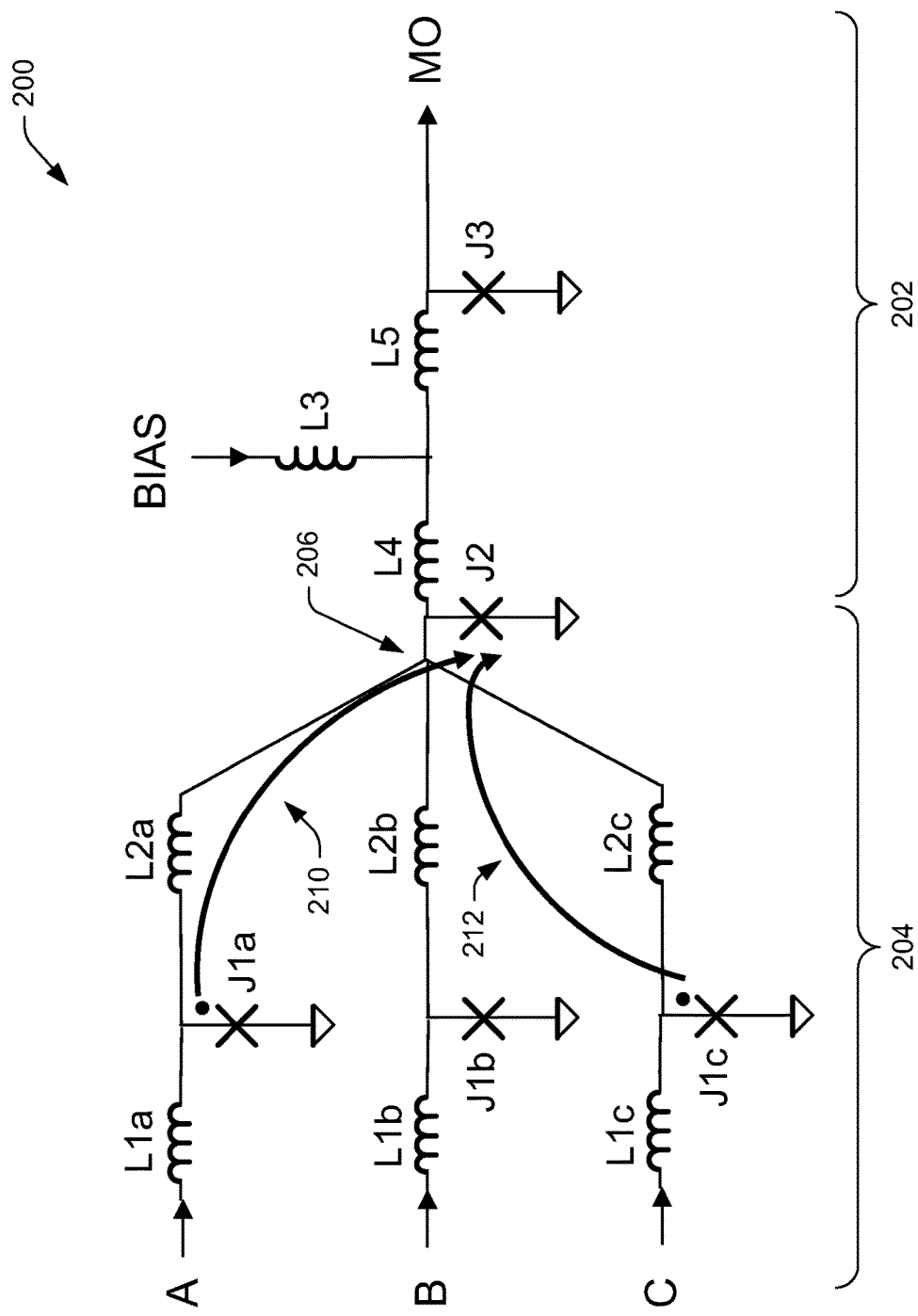
Figure 2E:
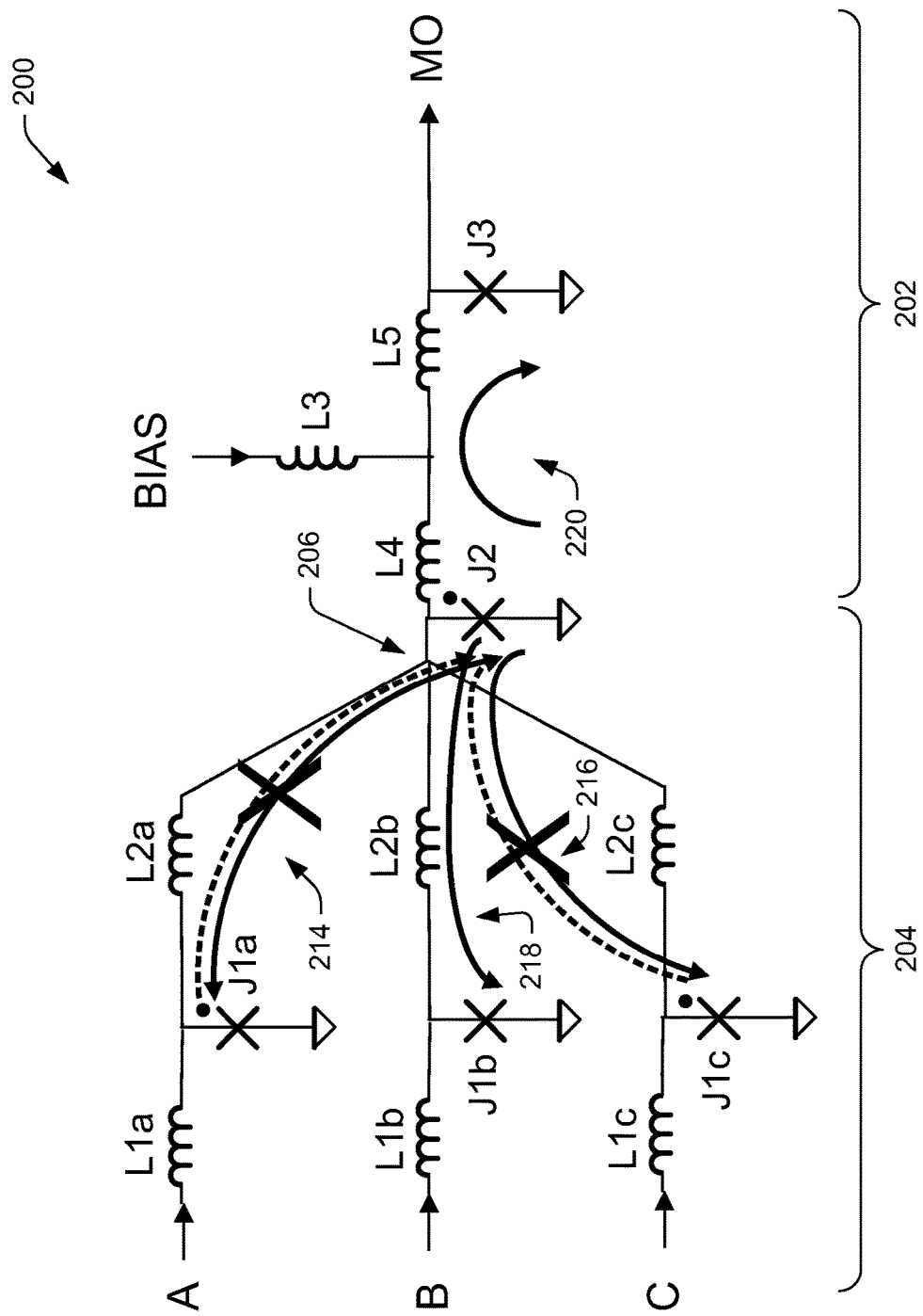

FIG. 2D shows the state of circuit 200 after two inputs (in the illustrated case, inputs A and C) have been asserted. Current 210 circulates in the storage loop formed by JJs J1a and J2 and storage inductor L2a, while current 210 circulates in the storage loop formed by JJs J1c and J2 and storage inductor L2c. The majority of asserted inputs bias logical decision JJ J2 towards a positive transition, but due to the size of input loop storage inductors L2a, L2b, and L2c, the storage loop currents are insufficient to cause this transition without additional bias current provided by the AC and DC bias BIAS. When the AC bias component has reached sufficient positive magnitude, i.e., when input stage 204 of gate 200 is positively "clocked," logical decision JJ J2 triggers. FIG. 2E shows the result of this transition. Stored positive currents in input loop storage inductors are annihilated 214, 216 by the resulting pulse coming out of logical decision JJ J2. The triggering also induces currents in any storage loops associated with inputs that were not asserted (e.g., current 218 in the storage loop associated with input B), but such currents are negative currents, i.e., in the opposite direction of storage loop currents induced by input assertion signals. Additionally, a current 220 is driven through inductors L4 and L5 and output JJ J3, or in other words, into output stage 202 to be amplified. This current, in combination with the AC bias, will trigger junction J3 propagating as an output signal out of the output MO of gate 200. Since all inputs are symmetric, this same series of events can happen with any combination of two or more asserted inputs to drive the output MO of gate 200 logical "high," giving the correct logical function for asserting the output of a 2-of-3 majority gate.

Any negative currents induced in unasserted inputs bias logical decision JJ J2 towards a negative transition, but not sufficiently to cause the transition alone, even with the AC and DC bias BIAS. This puts input stage 204 in the correct state to perform the correct logical function for de-asserting the output of input stage 204. Negative pulses arriving at any of the initially asserted inputs will provide negatively biasing currents in at least two of the three storage loops, such that in combination with the AC and DC bias BIAS they will unflip logical decision JJ J2 by causing it to transition out of its $2\pi$ phase, thereby de-asserting the output of input stage 204 back to logical "low." This will occur when the AC bias has reached sufficient negative magnitude, i.e., on the negative portion of the AC bias component of bias signal BIAS. If, instead, a positive input were to arrive at an input not previously asserted, it would annihilate the respective stored negative current and negative input pulses would be required at any two of the previously asserted inputs before de-asserting the output of input stage 204 and thus de-asserting the output MO of gate 200, again providing the correct function for a 2-of-3 majority gate.

Amplifying output stage 202 includes a JTL that propagates a pulse from logical decision JJ J2 through inductors L4 and L5 to trigger output JJ J3 and thus send a pulse out output MO, which assertion signal or de-assertion signal is indicative of a majority of inputs A, B, C being asserted, or de-asserted, respectively. Larger fan-in gates, such as a 3-of-5 majority gate, a 4-of-7 majority gate, etc., can be constructed by providing additional input branches dovetailing at node 206 and sizing components such that logical decision JJ J2 is biased to trigger only upon a majority of asserted inputs regardless of the number of input branches.

Gate 200 can serve as the basis for two-input logic gates such as AND and OR gates. Grounding one of the inputs (i.e., connecting one of the inputs to a circuit ground, effectively tying it to logical "low") creates a two-input AND gate with the remaining two inputs. Alternatively, using a DC bias to induce one $\Phi_0$ (i.e., one SFQ pulse) of current on one of the inputs (effectively tying it to logical "high") creates a two-input OR gate from the remaining two inputs.

Figure 3:
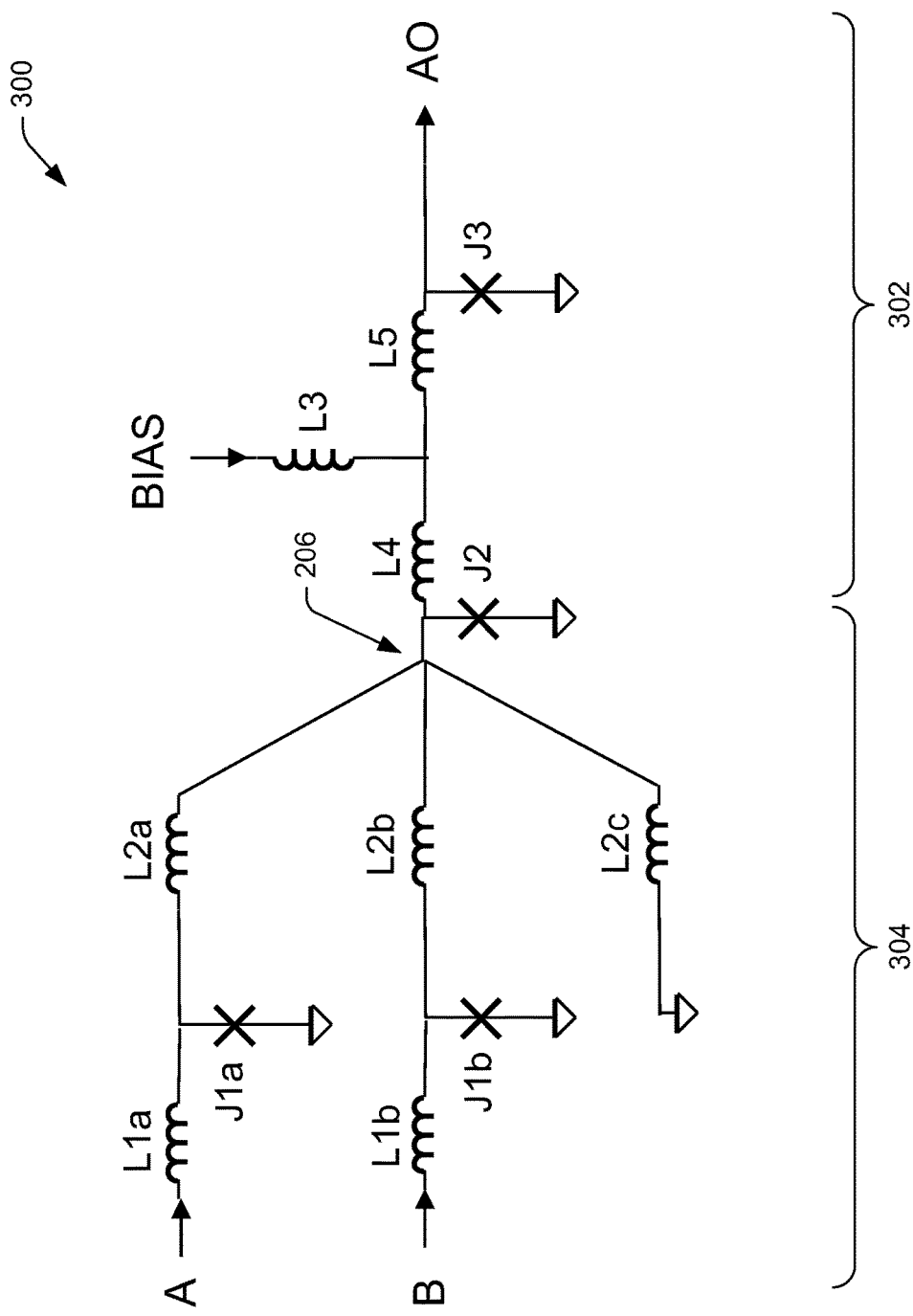
FIG. 3 is a circuit diagram of an example two-input AND gate.

FIG. 3 shows an example AND gate 300, specifically, an AND2 gate (i.e., a two-input AND gate) that is similar in configuration to the majority gate of FIG. 2, but with the third input C from FIG. 2 effectively tied to logical "low" by connecting it to a circuit ground. Consequently, leading inductor L1c and input JJ J1c from FIG. 2 are eliminated in input stage 304 of gate 300, as compared to input stage 204 of gate 200. In AND gate 300, L2c can be made slightly larger than L2a and L2b so as to include some additional inductance to compensate for the removed input junction J1c.

In AND gate 300 of FIG. 3, once logical decision JJ J2 triggers in response to asserted inputs A and B, positive currents in storage inductors L2a and L2b are destroyed, a negative current is induced into substitute storage inductor L2c, and a positive current is propagated into the output stage 302 for amplification as output AO. Thereafter, if any negative pulses are applied to de-assert any previously asserted inputs among logical inputs A and B, one or more negative currents stored in any of the storage loops associated with the logical inputs combines with the negative current stored in substitute storage inductor L2c to bias logical decision JJ J2 to untrigger upon the next negative portion of the AC component of the bias signal BIAS, which in turn propagates a negative pulse out of the output of input stage 304 into output stage 302 and thus de-asserts output AO.

Figure 4:
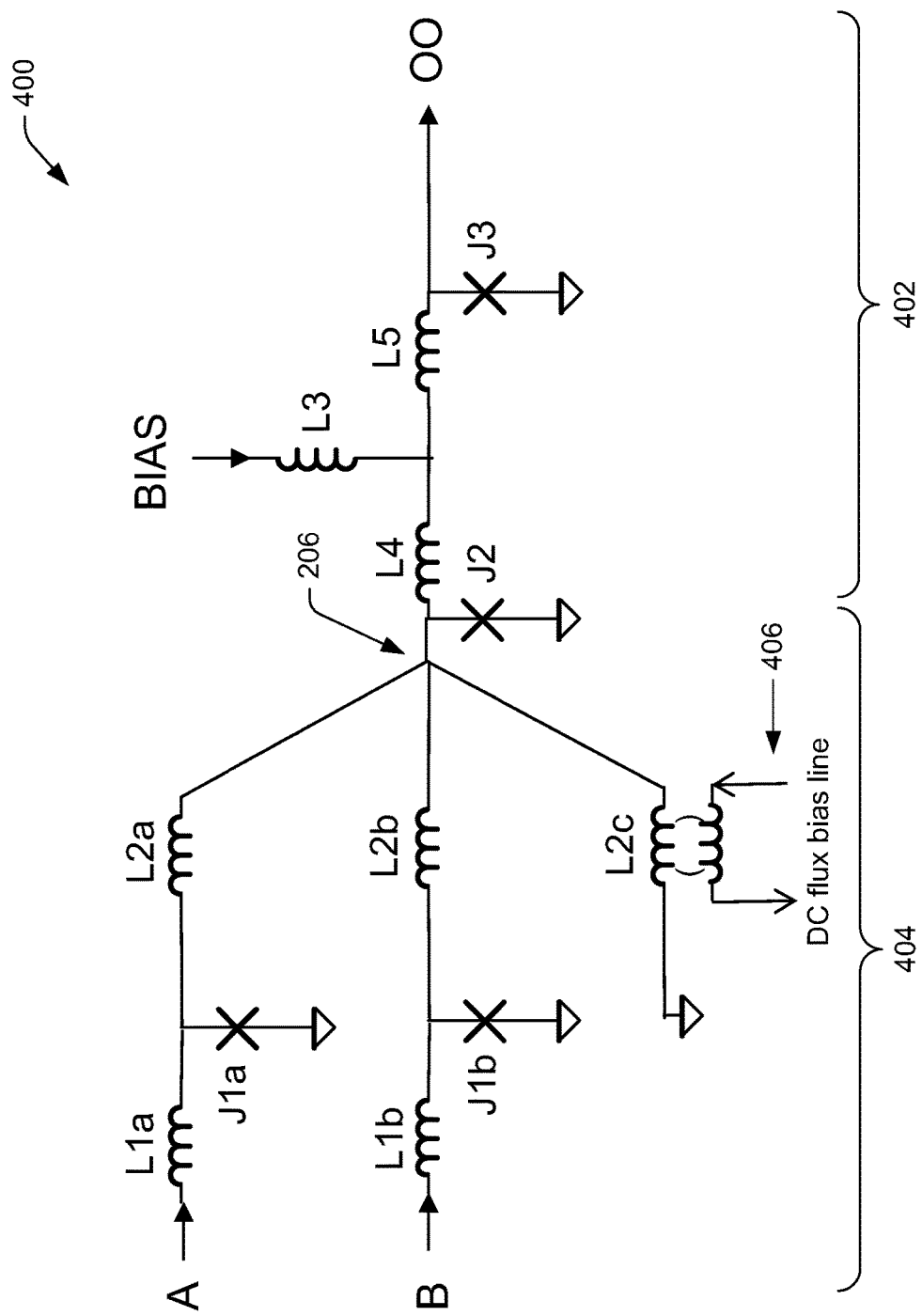
FIG. 4 is a circuit diagram of an example two-input OR gate.

FIG. 4 shows an example OR gate 400, specifically, an OR2 gate (i.e., a two-input OR gate), which is modified from the example majority gate 200 in a similar fashion to the two-input AND gate 300 of FIG. 3, but has transformer-coupled input inductor L2c in place of a storage inductor. In OR gate 400, output O0 is asserted if either or both of logical inputs A or B is asserted. Transformer-coupled input inductor L2c is transformer-coupled to DC flux bias line 406. In a similar configuration, not illustrated, bias quantizing JJ J1c (not shown) can be connected between, on one side, transformer-coupled input inductor DC_c_0 (not shown) and substitute storage inductor L2c, and, on the other side, a circuit ground such that quantizing JJ J1c (not shown) quantizes the DC bias current supplied through DC bias DC_c_0 (not shown) and improves operating margins. In such configuration, DC_c_0 would be tied to the circuit ground on the other side from the node where it is connected to quantizing JJ J1c.

In the illustrated circuit 400, DC current provided through DC flux bias line 406 stays constant throughout system operation. At system start-up, the DC current through DC flux bias line 406 couples current into input inductor L2c (or DC_c_0, in the alternate, non-illustrated configuration) to which it is transformer-coupled, via the AC transient that occurs at system power-up. In the illustrated configuration 400, this puts a positive current (e.g., one $\Phi_0$ of current) into inductor L2c once at the beginning of operation, which contributes to the biasing of logical decision JJ J2 just as much as biasing from either of the logical inputs A, B. In the alternate, non-illustrated configuration, this triggers bias quantizing JJ J1c once at the beginning of operation, putting a positive current into substitute storage inductor L2c, which contributes to the biasing of logical decision JJ J2 just as much as biasing from either of the logical inputs A, B.

Upon assertion of either of the logical inputs A, B, logical decision JJ J2 in input stage 404 of OR gate 400 of FIG. 4 then effectively sees "two" out of "three" inputs asserted, one of the "two" inputs being the asserted logical input and the other of the "two" asserted inputs being the non-logical, phantom "input" initiated by the DC bias. Logical decision JJ J2 therefore triggers in response to at least one asserted input among logical inputs A, B. Upon such triggering, the positive current in substitute storage inductor L2c is destroyed, J1c does not untrigger, positive currents in storage inductors L2a and/or L2b are destroyed should the inputs associated with those storage inductors have been asserted, negative currents are induced in the storage inductors associated with any unasserted inputs, and a positive current is propagated into output stage 402. The amplifying action of output stage 402 consequently provides an amplified signal at output OO in FIG. 4. (The non-illustrated OR2 gate configuration with a quantizing junction functions similarly.)

Thereafter, if negative pulses are applied to de-assert all of previously asserted inputs among logical inputs A and B, the negative currents stored in the storage loops associated with the logical inputs combine to bias logical decision JJ J2 to untrigger upon the next negative portion of the AC component of the bias signal BIAS, which in turn propagates a negative pulse into output stage 402 and a negative pulse out of output O0. This untriggering of logical decision JJ J2 restores the positive current to substitute storage inductor L2c, bringing the circuit back to its initial state, i.e., the state following start-up injection of initial positive current into substitute storage inductor L2c via DC flux bias line 406.

Figure 5:
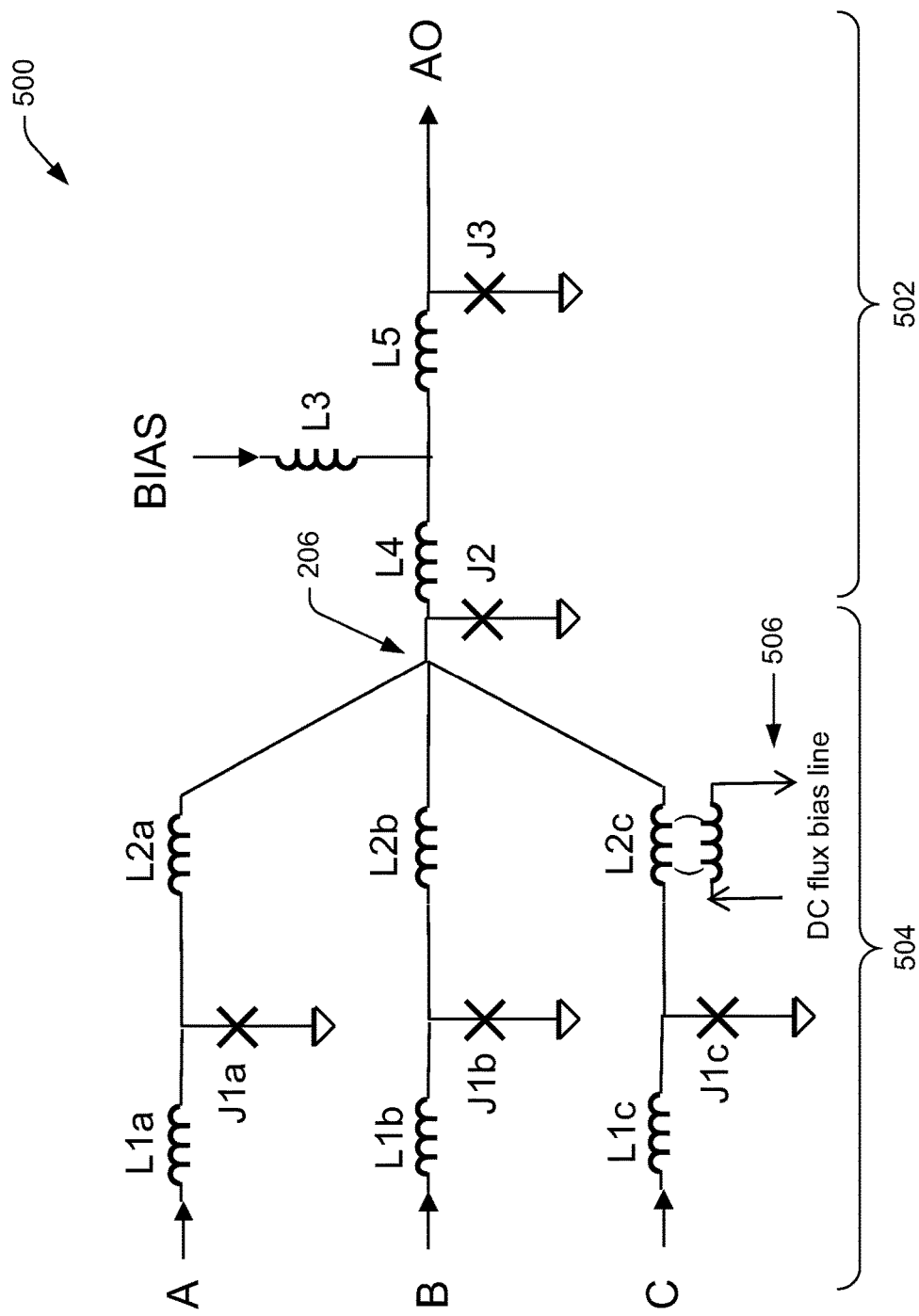
FIG. 5 is a circuit diagram of an example three-input AND gate.

FIG. 5 illustrates a three-input AND gate 500 that retains all three inputs A, B, C of circuit 200, and includes input stage 504 and output stage 502, but is configured to initialize one of the internal storage loops to one $\Phi_0$ of current in the counter-clockwise direction by providing such current to DC flux bias line 506. In AND gate 500, the initial current works against the central, logical decision JJ J2 triggering in the positive direction. A positive input pulse must first arrive on this input (i.e., logical input C, as illustrated) so as to annihilate the stored current (i.e., stored in L2c, as illustrated). The remaining two inputs then function as described above. In alternative implementations, ⅓ of a $\Phi_0$ of counter-clockwise current could be initialized into each of the three storage loops, by providing DC flux bias lines transformer-coupled to all three loops (not shown) in similar fashion to how one is shown in FIG. 5 (506/L2c), or ½ $\Phi_0$ of counter-clockwise current could be initialized into two of them, by providing DC flux bias lines transformer-coupled to those two storage loops (not shown), to yield the same effect as putting one $\Phi_0$ of current in the counter-clockwise direction in only one of the storage loops.

Larger fan-in gates, such as 3-input AND and OR gates, can be constructed by providing additional input dovetailing branches and sizing components such that logical decision JJ J2 is biased to trigger only upon appropriate input assertion conditions, regardless of the number of input branches. Similarly, an OA21 gate can constructed by modifying a 3-of-5 majority gate input stage structure to provide one input to two parallel branches, or to a single branch having doubled JJ sizes and halved inductor sizes, and by effectively tying one of the five inputs to logical "low" by connecting it to a circuit ground.

Figures 6A, 6B:
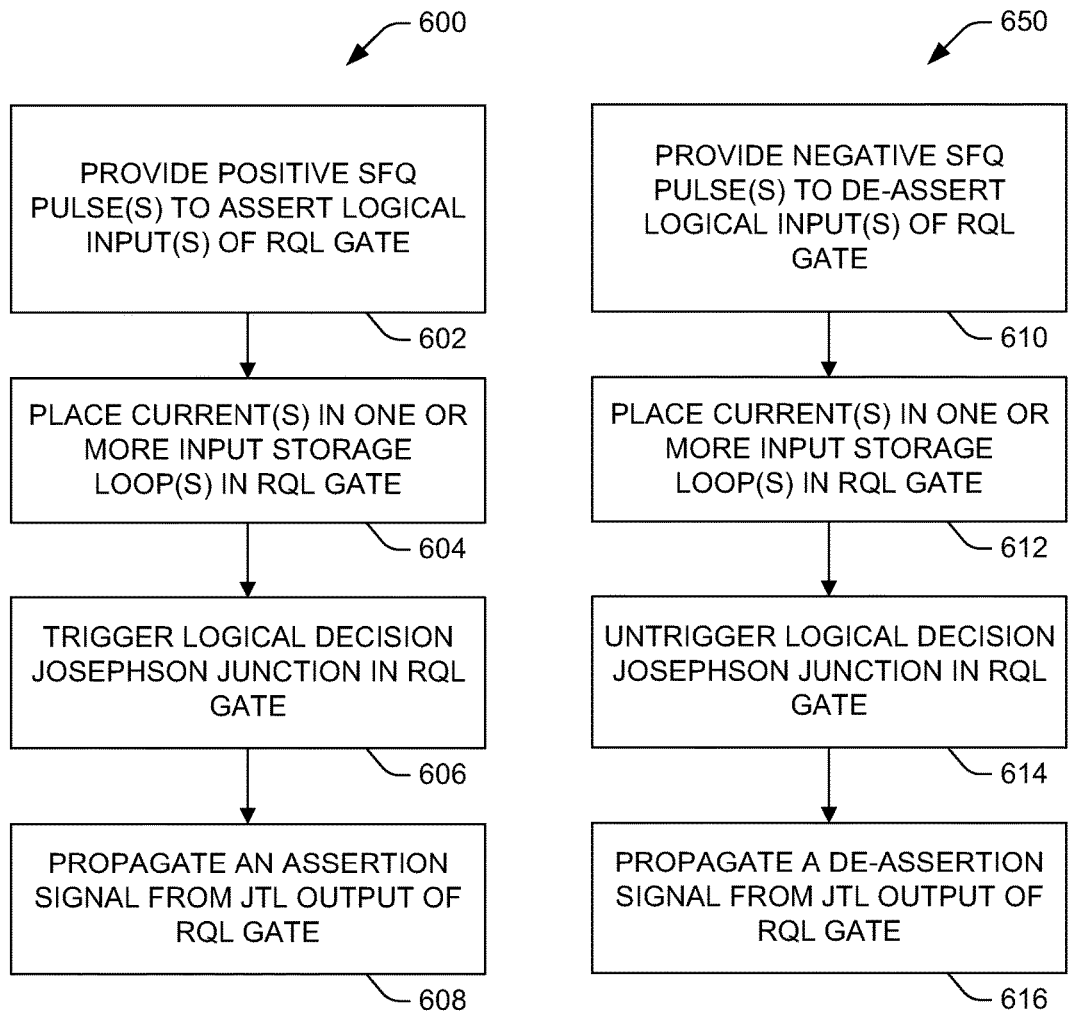
FIGS. 6A and 6B are flow diagrams of example methods of determining a logical output from an RQL gate having at least two logical inputs based on single flux quantum (SFQ) pulse inputs.

FIG. 6A shows method 600 of determining a logical output from an RQL gate having at least one logical input based on SFQ pulse inputs. One or more positive SFQ pulses are provided 602 to assert one or more logical inputs of an RQL gate having at least two logical inputs to place 604 one or more currents in one or more input storage loops associated with the asserted inputs, e.g., one loop per input. The RQL gate can be, for example, like any of gates 100, 200, 300, 400, or 500 shown in FIGS. 1-5, or can be extensions of such examples providing a greater number of inputs and/or combining or splitting input storage loop branches, as discussed previously. A JJ that is configured to trigger based on the assertion of a certain number of the logical inputs, or certain ones of the logical inputs, then triggers 606. The JJ can be so configured, for example, by making it common to all of the input storage loops, by effectively tying to logical "high" or logical "low" additional inputs not counted among the logical inputs, by providing appropriate biasing, and/or by appropriate component sizing. An assertion signal, generated as a result of the triggering, then propagates 608 from an output of the RQL gate. The assertion signal can result from an amplification of a signal resulting from the triggering of the logical decision JJ. For example, the amplification can be provided by a JTL. The assertion signal can be, for example, a single positive SFQ pulse.

FIG. 6B shows method 650 of determining a logical output from an RQL gate based on SFQ pulse inputs, which can continue from method 600 shown in FIG. 6A. Negative SFQ pulses are provided 610 to de-assert one or more logical inputs of an RQL gate to place 612 one or more currents in one or more input storage loops associated with the asserted inputs, e.g., one loop per input, where the gate has more than two such storage loops. The placed currents can be negative currents, i.e., currents equal and opposite to the currents placed 604 in method 600. Again, the RQL gate can be, for example, like any of gates 100, 200, 300, 400, or 500 shown in FIGS. 1-5, or can be extensions of such examples providing a greater number of inputs and/or combining or splitting input storage loop branches, as discussed previously. A JJ that is configured to untrigger based on the de-assertion of a certain number of the logical inputs, or certain ones of the logical inputs, then untriggers 614. The JJ can be so configured, for example, by making it common to all of the input storage loops, by effectively tying to logical "high" or logical "low" additional inputs not counted among the logical inputs, by providing appropriate biasing, and/or by appropriate component sizing. A de-assertion signal, generated as a result of the triggering, then propagates 616 from an output of the RQL gate. The de-assertion signal can be, for example, a single negative SFQ pulse, opposite to the pulse propagated 608 in method 700.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) gate circuit comprising:
    an input stage having at least two logical inputs each configured to be asserted based on receiving a positive single flux quantum (SFQ) pulse, the input stage comprising two or more storage loops, each logical input being associated with at least one of the storage loops, each of the storage loops associated with a logical input comprising an input Josephson junction (JJ), a storage inductor, and a logical decision JJ, the logical decision JJ being common to all the storage loops associated with the logical inputs and being configured to trigger based on biasing provided by one or more currents stored in the storage loops and a bias signal provided to the circuit; and
    an output stage comprising Josephson transmission line (JTL) circuitry configured to assert an output based on a triggering of the logical decision JJ.

2. The circuit of claim 1, wherein the output stage is further configured to de-assert the output based on the untriggering of the logical decision JJ.

3. The circuit of claim 1, wherein the input stage has exactly three logical inputs, and the output stage is configured to assert the output based on assertion of at least two of the logical inputs.

4. The circuit of claim 1, wherein the input stage has exactly two logical inputs, and the output stage is configured to assert the output based on assertion of both of the logical inputs.

5. The circuit of claim 1, wherein the input stage has exactly two logical inputs, and the output stage is configured to assert the output based on assertion of one or both of the logical inputs.

6. The circuit of claim 5, wherein the input stage comprises a non-input storage loop not associated with either of the two logical inputs that includes a transformer-coupling to a DC flux bias line configured to introduce positive current into the non-input storage loop at system start-up.

7. The circuit of claim 1, wherein the input stage has exactly three logical inputs, and the output stage is configured to assert the output based on assertion of all three of the logical inputs.

8. The circuit of claim 7, further comprising a DC flux bias line transformer-coupled to exactly one of the storage inductors in one of the logical input storage loops, the DC flux bias line being configured to introduce one $\Phi_0$ of current into the corresponding storage loop at system start-up.

9. The circuit of claim 7, further comprising two DC flux bias lines each transformer-coupled to one of the storage inductors in one of the logical input storage loops, the DC flux bias lines each being configured to introduce ½ of a $\Phi_0$ of current into the corresponding storage loop at system start-up.

10. The circuit of claim 7, further comprising three DC flux bias lines each transformer-coupled to one of the storage inductors in one of the logical input storage loops, the DC flux bias lines each being configured to introduce ⅓ of a $\Phi_0$ of current into the corresponding storage loop at system start-up.

11. A method of determining a logic value comprising:
providing one or more positive single flux quantum (SFQ) pulses to assert one or more logical inputs of a reciprocal quantum logic (RQL) gate having at least two logical inputs;
based on the providing, placing one or more positive currents in one or more input storage loops in the RQL gate, the RQL gate having at least three such storage loops;
based on the placing, triggering a logical decision Josephson junction (JJ) in the RQL gate; and
based on the triggering, propagating an assertion signal from an output of the RQL gate.

12. The method of claim 11, further comprising, after the propagating:
providing one or more negative SFQ pulses to de-assert one or more of the logical inputs;
based on the providing the one or more negative SFQ pulses, placing one or more negative currents in one or more of the input storage loops;
based on the placing the one or more negative currents, untriggering the logical decision JJ; and
based on the untriggering, propagating a de-assertion signal from the output of the RQL gate.

13. The method of claim 11, further comprising providing a bias signal having an AC component, and wherein the triggering is further based on the bias signal.

14. A circuit comprising:
at least two logical input Josephson transmission lines (JTLs) each connected to a dovetail node, each logical input JTL comprising a storage loop input inductor connected, at a respective first node, to an input Josephson junction (JJ) and a storage inductor, the storage loop input inductor, input JJ, and storage inductor of each logical input JTL being sized to provide unidirectional data flow;
a logical decision JJ connected between the dovetail node and a low-voltage node, such that respective storage loops are formed by the input JJ and storage inductor of each input JTL and the logical decision JJ;
output JTL circuitry connecting the dovetail node and a logical output node to amplify a logical decision signal made by the logical decision JJ; and
a bias input providing a bias signal having an AC component,
wherein the circuit is configured to provide an asserted or de-asserted logical output signal at the output node based on asserted or de-asserted logical input signals provided to the logical input JTLs, respectively.

15. The circuit of claim 14, having exactly three logical input JTLs that intersect at the dovetail node, wherein the output signal provides a 2-of-3 majority function based on the logical input signals provided to the three logical input JTLs.

16. The circuit of claim 15, having no more than five JJs.

17. The circuit of claim 14, having exactly two logical input JTLs that intersect at the dovetail node along with an inductor between the dovetail node and a circuit ground, wherein the output signal provides an AND function based on the logical input signals provided to the two logical input JTLs.

18. The circuit of claim 14, having no more than four JJs.

19. The circuit of claim 14, having two logical input JTLs that intersect at the dovetail node along with an inductor between the dovetail node and a circuit ground, the inductor being transformer-coupled to a DC flux bias line and configured to quantize a DC flux bias current supplied through the transformer coupling at system start-up, wherein the output signal provides an OR function based on the logical input signals provided to the two logical input JTLs.

20. The circuit of claim 14, having exactly three logical input JTLs that intersect at the dovetail node, at least one of the storage inductors in at least one of the three logical input JTLs being transformer-coupled to a DC flux bias line and configured to introduce a negative current into the respective logical input JTL.

* * * * *